(12) United States Patent
Holmes et al.

(10) Patent No.: US 7,071,419 B2
(45) Date of Patent: Jul. 4, 2006

(54) TEAR RESISTANT FLEXIBLE SUBSTRATE

(75) Inventors: Benjamin J. Holmes, Norcross, GA (US); Randall P. Chambers, Lawrenceville, GA (US)

(73) Assignee: Motorola, Inc., Schaumburg, IL (US)

( * ) Notice: Subject to any disclaimer, the term of this patent is extended or adjusted under 35 U.S.C. 154(b) by 312 days.

(21) Appl. No.: 10/683,106

(22) Filed: Oct. 8, 2003

(65) Prior Publication Data

US 2005/0077078 A1    Apr. 14, 2005

(51) Int. Cl.
*H05K 1/11* (2006.01)

(52) U.S. Cl. ............... 174/254; 174/262; 361/749; 361/750; 361/751

(58) Field of Classification Search .......... 174/254, 174/262; 361/749–751, 776, 789
See application file for complete search history.

(56) References Cited

U.S. PATENT DOCUMENTS

| | | | | |
|---|---|---|---|---|
| 4,335,272 A | * | 6/1982 | Pittenger | 174/254 |
| 5,170,328 A | * | 12/1992 | Kruppa | 361/749 |
| 5,224,023 A | * | 6/1993 | Smith et al. | 361/784 |
| 5,406,034 A | * | 4/1995 | Frei et al. | 174/266 |
| 5,414,221 A | * | 5/1995 | Gardner | 174/261 |
| 5,817,151 A | * | 10/1998 | Olson et al. | 607/142 |
| 6,039,889 A | | 3/2000 | Zhang et al. | |
| 6,153,834 A | * | 11/2000 | Cole et al. | 174/260 |
| 6,350,387 B1 | * | 2/2002 | Caron et al. | 430/314 |
| 6,590,165 B1 | * | 7/2003 | Takada et al. | 174/266 |
| 6,594,152 B1 | * | 7/2003 | Dent | 361/785 |
| 6,921,867 B1 | * | 7/2005 | Christensen | 174/254 |
| 6,927,344 B1 | * | 8/2005 | Gall et al. | 174/254 |

* cited by examiner

*Primary Examiner*—Randy W. Gibson
*Assistant Examiner*—Hoa C. Nguyen
(74) *Attorney, Agent, or Firm*—Hisashi D. Watanabe

(57) ABSTRACT

A flexible circuit having improved tear resistance is provided. A flexible circuit, made of polyimide film, includes at least one extension which needs to be folded. To prevent tearing, an annular piece of metal, like an exposed copper pad for example, is placed at the apex of the bend angle. A second metal is then deposited atop the annular piece of metal, thereby reinforcing the annular piece of metal. The reinforced annular piece of metal helps to prevent the flexible circuit from tearing when shearing forces are applied to the extension. Experimental results have shown that the invention provides as much as a 285% increase in tear resistance when compared to prior art flexible circuits.

13 Claims, 9 Drawing Sheets

TEAR RESISTANT FLEXIBLE SUBSTRATE

BACKGROUND

1. Technical Field

This invention relates generally to flexible circuit substrates, and more specifically to a tear resistant flexible circuit substrate.

2. Background Art

Over one hundred and forty million Americans now use a cellular telephone and another fifteen million or so are expected to subscribe in the coming year. Sales of cellular phones have risen faster than those of facsimile machines, subscriptions to cable television service, and sales of videocassette recorders. Cellular telephones have become a feature across both the business and recreational landscapes. Customers have come to expect, and demand, steady increases in reliability and portability of the telephones. They have also come to demand the constant reductions in cost of the telephones.

A critical aspect of the reliability of the cellular telephone is the reliability of its power source, the battery. The battery may well be the single most important feature in a cellular telephone, or for that matter, in other types of electronic devices, including two-way radios. Consumer surveys have shown that talk time is the feature valued by users of cellular telephones and two-way radios above all else.

At the same time, consumers are demanding smaller and smaller phones. Consequently, the non-cell components of the corresponding battery pack, like the safety circuitry, charging circuitry and fuel gauging circuitry, have become smaller to deliver greater talk time without increasing the size of the battery. The advent of flexible circuits has been integral in the size reduction of these circuits.

By way of background, not too long ago, electronic circuits were mounted upon printed circuit boards. These printed circuit boards were rigid, flat boards made of layers of fiberglass with copper pads and traces disposed atop and between these layers. Printed circuit boards were difficult to work with in the small confines of a batter pack in that they were both bulky and rigid. The thickness of the printed circuit boards increased the overall thickness of the pack, and the rigidity prevented the printed circuit board from folding about the cell.

To remedy these issues, a new substrate, known as a "flexible circuit substrate" was developed. These substrates, affectionately known as "flexes", are generally manufactured from polyimide films, like Kapton®, manufactured by the DuPont Company (See, e.g., www.dupont.com/kapton/). Kapton® is a semi-transparent film that is durable, flexible and heat resistant, and is used in applications ranging from circuit substrates to automotive wiring harnesses to solar cell and space exploration applications.

By depositing conductive copper pads and traces atop and between layers of Kapton®, durable flexible circuits are made. The use of flexible circuits in battery packs is well known. For example, commonly assigned U.S. Pat. No. 6,153,834, entitled "Flexible Circuit with Tabs for Interconnection to Battery Cells, issued Nov. 28, 2000, incorporated by reference herein, teaches the use of a flexible circuit in conjunction with a battery pack.

One problem that exists with polyimide films like Kapton® involves tearing. Much like a bag of potato chips that is initially difficult to open, but once torn tears very easily, polyimide films tend to tear very easily once a tear has been initiated. As many battery pack designs, like that taught in the '834 patent mentioned above, employ flexes that have extensions that are bent in different directions, any tearing of the flex may render the battery inoperable. The reason for this is that tears in the flex may in turn tear critical conductive traces within the flex.

There is thus a need for an improved flexible circuit substrate that is resistant to tearing.

DETAILED DESCRIPTION OF THE INVENTION

Figure 1:
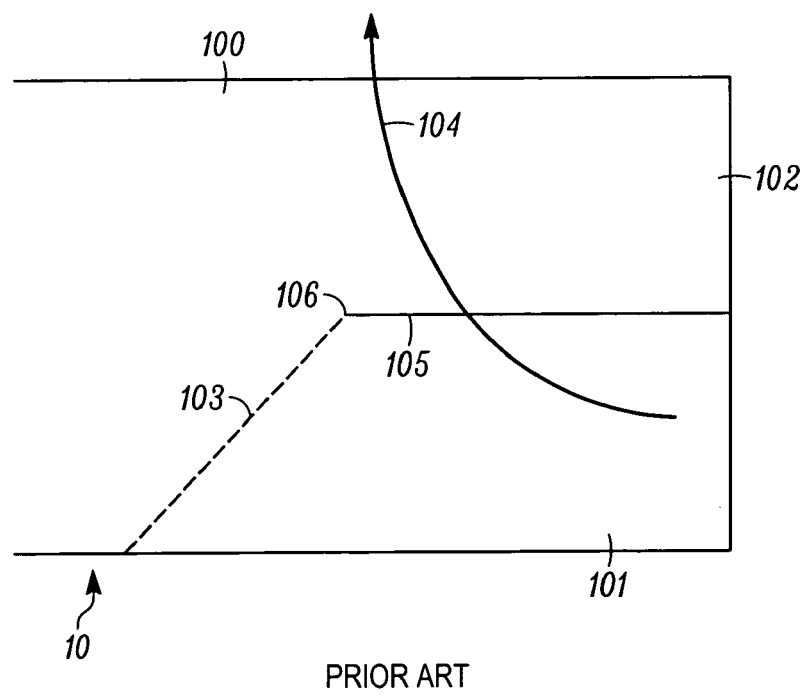
FIG. 1 illustrates a prior art flex.

A preferred embodiment of the invention is now described in detail. Referring to the drawings, like numbers indicate like parts throughout the views. As used in the description herein and throughout the claims, the following terms take the meanings explicitly associated herein, unless the context clearly dictates otherwise: the meaning of "a," "an," and "the" includes plural reference, the meaning of "in" includes "in" and "on."

Referring now to FIG. 1, illustrated therein is a prior art flexible circuit substrate 10, or "flex". The flex 10 is made from a polyimide film, like Kapton® for example. Due to design requirements, such a flex is often required to bend in many applications. As such, the flex 10 includes a central portion 100 with a first extension 101 and a second extension 102 extending from the central portion 100 of the flex 10.

Between the two extensions 101,102 is as parting line 105. The parting line 105 may be as simple as a slit cut into the flex to facilitate bending of the extensions 101,102 in different directions, or may be more complex shapes. In either case, the parting line 105 ends at a termination point 106.

For exemplary purposes, a simple, single fold will be used as an illustration. To make this simple, single fold, extension 101 will be folded across extension 102 and the central member 100 in the direction of line 104. Folding line 103 illustrates where the flex 10 is intended to bend when extension 101 is folded.

Figure 2:
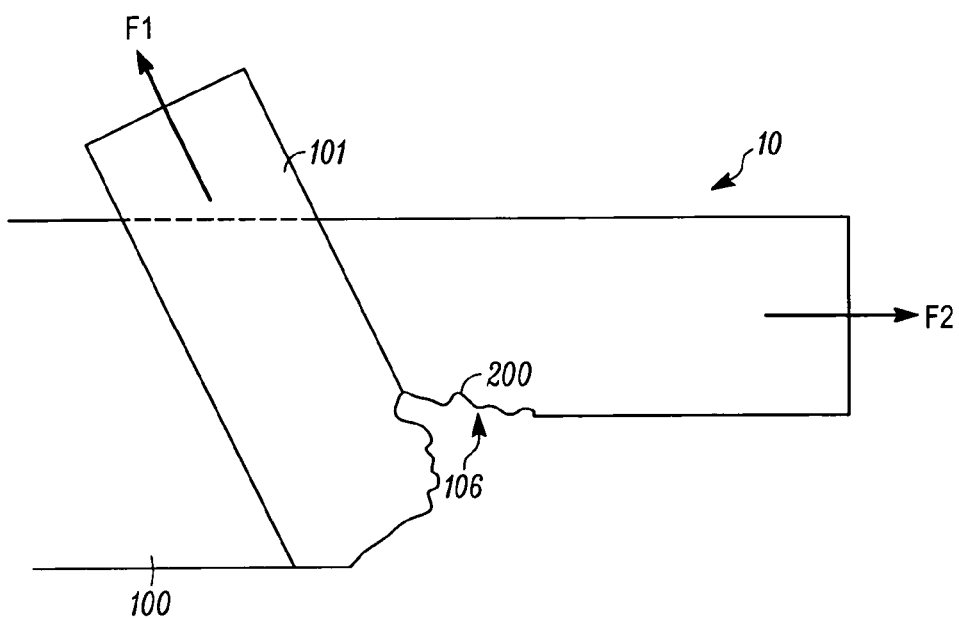
FIG. 2 illustrates a prior art flex that has torn due to bending.

Referring now to FIG. 2, illustrated therein is the problem associated with prior art flexes. When extension 101 is folded across the central member 100, the folding forces, exerted naturally against the termination point 106, will often cause the flex 10 to tear. For example, force F1 and F2 act as a shearing force against the flex 10. Robust materials, like Kapton®, will initially resist tearing, so long as the shearing force remains below about 0.6 lbs. However, once this limit is exceeded, a tear 200 will result. Once the tear has started, forces less than 0.1 lbs can increase the length of the tear 200.

Figure 3:
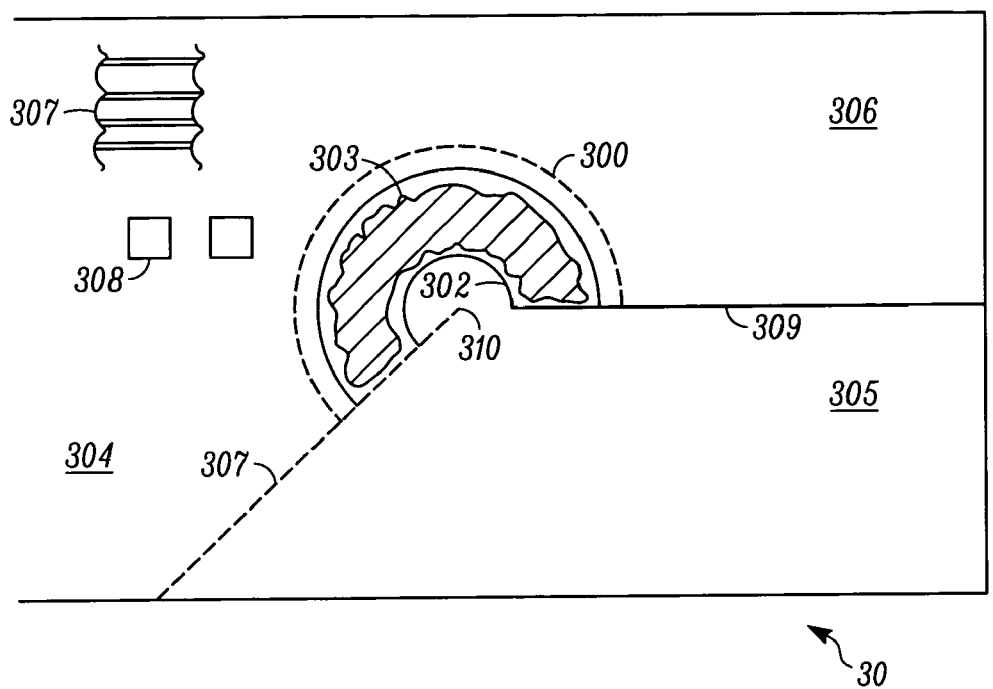
FIG. 3 illustrates a flex in accordance with the invention.

Referring now to FIG. 3, illustrated therein is a tear-resistant flex 30 in accordance with the invention. The flex 30 is made of at least two layers of flexible material, like polyimide films. Between and/or atop the layers, electrically conductive traces 307 may be disposed. These traces may be manufactured from copper, copper alloys, aluminum, or other equivalent conductors. Electrically conductive pads 308 may be disposed atop the layers. The pads 308 may couple to the traces 307 so as to form a circuit network. Electrical components (not shown) may be coupled to the pads 308.

The flex 30 includes a central member 304 from which at least one extension 305 extends. In keeping with the illustrative example of FIGS. 1 and 2, the flex 30 is shown with two extensions 305,306, although the invention is not so limited. It will be clear to those of ordinary skill in the art who have the benefit of this disclosure that any number of extensions, in any number of shapes, may extend in any number of directions from the central member.

Between the two extensions 305,306 is as parting line 309. The parting line 309 may be as simple as a slit cut into the flex to facilitate bending of the extensions 305,306 in different directions, or may be more complex, cut-away shapes as noted in subsequent paragraphs. In either case, the parting line 309 ends at a termination point, shown here as point 310.

An annular member 300 is disposed about the termination point 310. The annular member 300 is preferably made of metal. To reduce cost of the overall flex 30, it is often desirable to construct the annular member 300 from the same metal as the conductive traces 307. The annular member 300 is thus preferably constructed from copper, copper alloys, aluminum or other conductors.

A second metal 303 is deposited upon the annular member 300. The second metal 303 serves to reinforce and strengthen the annular member 300. To reduce overall cost, the second metal 303 is preferably solder that is deposited upon the annular member 300 by way of reflow soldering, hand soldering, wave soldering or other equivalent method. While soldering works well, other methods, like vapor deposition or plating would also suffice.

If solder is employed as the second metal 303, it is desirable to include an aperture 301 in at least one of the film layers of the flex 30. The aperture 301 allows the annular member to contact solder during conventional manufacturing processes, like reflow soldering for example. To properly retain the annular member 300 between the film layers, the area of the aperture 301 should be less than the area of the annular member 300. For a single sided flex (pads only on one side of the flex), the aperture 301 may only pierce the top layer of film, whereas for double sided flexes (pads on both the top and bottom of the flex), apertures may be found through both the top and bottom layers of film, thereby allowing the second metal to be deposited on both the top and bottom of the annular member 300.

For convenience in folding, a second aperture 302 may be added about the termination point. The second aperture 302 is essentially a hole that passes through all the layers of the flex 30, as well as through the annular member 300. The second aperture 302 is added to the annular member 300 prior to the deposition of the second metal 303.

The length of the annular member 300 will vary depending upon the application. For this exemplary embodiment, where one extension 305 is being folded in a perpendicular fashion with respect to the central member 304, a fold line 307 indicates where the fold will be made. The annular member 300 runs approximately 225 degrees, in that it runs from the parting line to the fold line. Other applications, as will be discussed with respect to FIGS. 6–8, may require greater or lesser angles.

Figure 4:
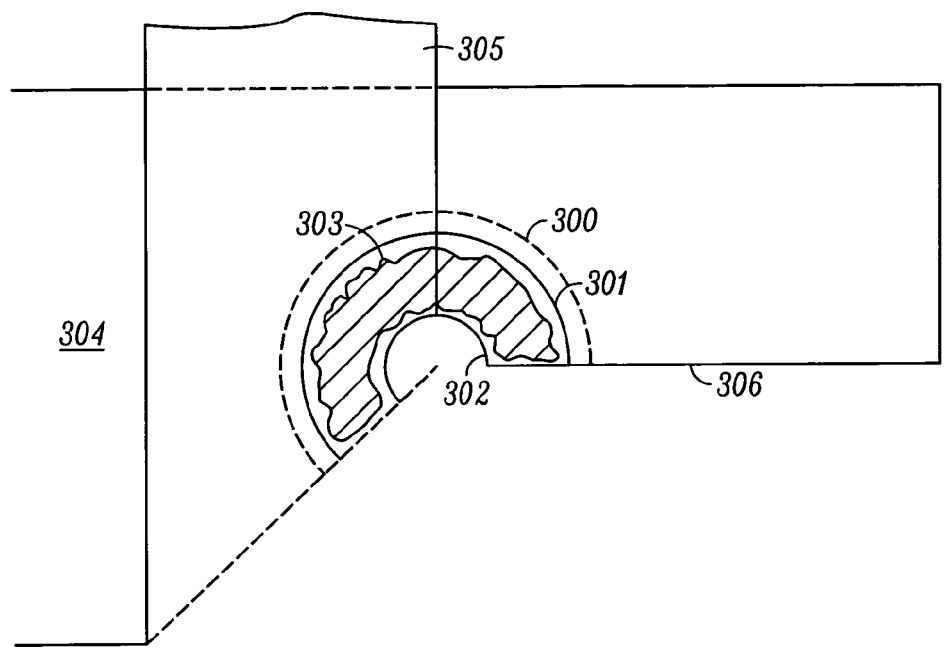
FIG. 4 illustrates a flex in accordance with the invention after folding an extension.

Referring now to FIG. 4, illustrated therein is the substrate of FIG. 3 after the extension 305 is folded. Note that the annular member 300, with the second metal 303 deposited atop, functions as a mechanical restraint that prevents the flex 30 from tearing when shearing forces are applied to the extensions 305,306. Experimental results have shown that for both single sided (pads only on one side of the flex) and double sided (pads on both the top and bottom of the flex), employing the annular member with a second metal deposited atop has greatly improved the tear strength against shearing forces. Consider the following table:

TABLE 1

| Test | Tear Force | (lbs.) |      |      |      |      |      | Std. Dev. | Avg. |
|------|------------|--------|------|------|------|------|------|-----------|------|
| 1    | 0.56       | 0.57   | 0.57 | 0.28 | 0.57 | 0.57 | 0.56 | 0.108452  | 0.525714 |
| 2    | 1.14       | 1.13   | 1.13 | 1.13 | 1.13 | 1.13 | 1.14 | 0.00488   | 1.132857 |
| 3    | 1.98       | 2.27   | 1.65 | 1.42 | 1.72 | 1.42 | 1.99 | 0.31725   | 1.778571 |
| 4    | 0.57       | 0.85   | 0.85 | 0.56 | 0.85 | 0.57 | 1.13 | 0.213263  | 0.768571 |
| 5    | 2.01       | 2      | 2.28 | 2.27 | 2.29 | 2.58 | 3.17 | 0.403131  | 2.371429 |
| 6    | 2.3        | 2.3    | 2.47 | 3.14 | 3.75 | 3.43 | 3.46 | 0.610503  | 2.978571 |

In table 1, tests 1 and 4 represent a single sided flex and double sided flex, respectively, that includes only a parting line between extensions (similar to FIG. 1). In these two tests, the pull strength to tear the flex was less than 1 lb. Tests 2 and 5 are single and double sided flexes, respectively with only an annular member. In other words, there is no second metal deposited atop the annular member for these tests.

Tests 3 and 6 correspond with the present invention, in that test 3 is a single sided flex with an annular member disposed about the termination point of the parting line, the annular member having a second metal deposited thereon. Test 4, correspondingly, is a double sided flex with an annular member having the second metal deposited upon both sides. Note that test 3 increases tear resistance by 240% over the flex alone, and by 56% over the flex with only an annular ring. Test 6 increases the tear resistance by 285% over the flex alone, and by 25% over the flex with only an annular ring.

Figure 6:
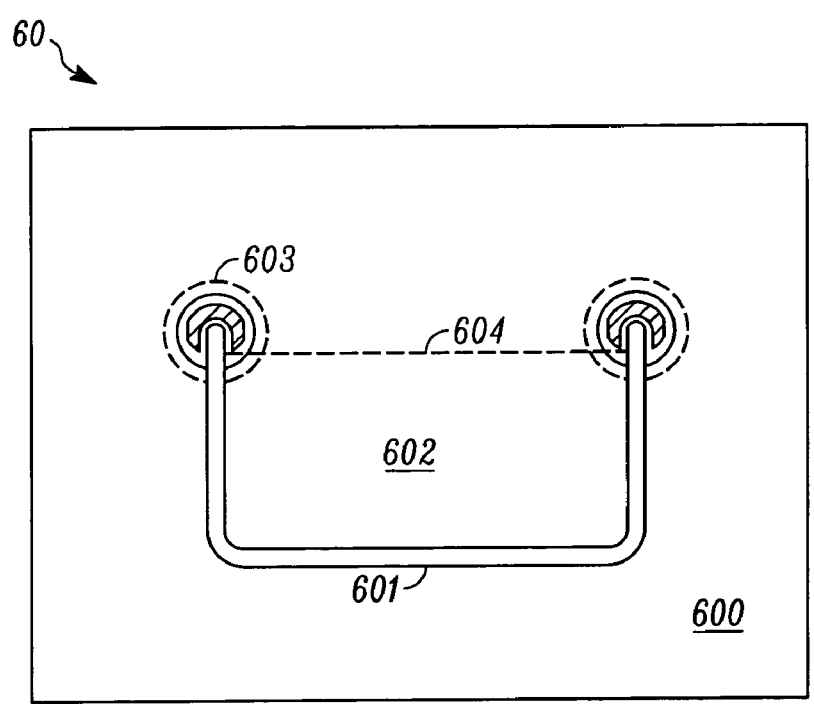
FIGS. 6–9 illustrated exemplary flexes in accordance with the invention.
Figure 7:
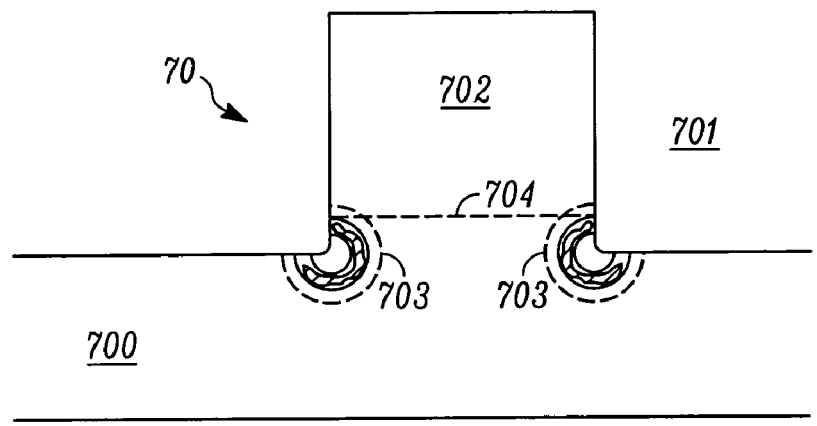
Figure 8:
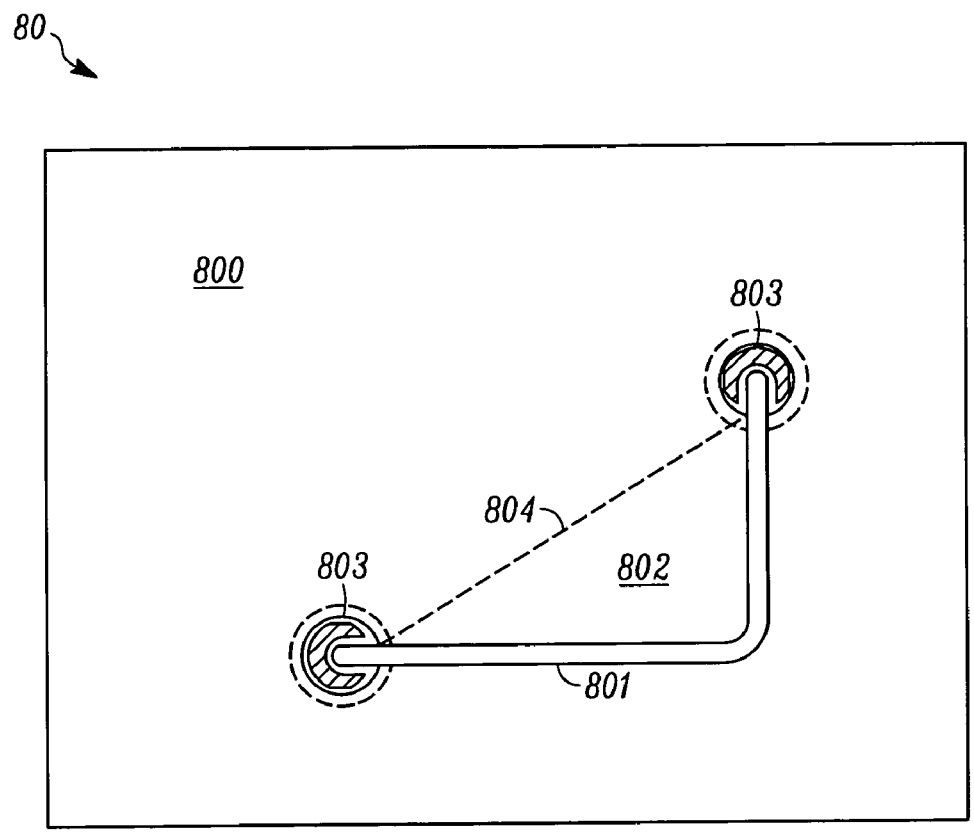

Referring now to FIGS. 6–8, illustrated therein are some of the various folding applications to which the invention may be applied. FIGS. 6–8 do not represent all of the applications, but rather are for exemplary purposes only. It will be clear to those of ordinary skill in the art who have the benefit of this disclosure that other scenarios also exist.

With respect to FIG. 6, the parting line 601 is U-shaped, thereby allowing a U-shaped extension 602 to fold across the central member 600 of the flex 60 along folding line 604. In this embodiment, the annular members 603 may run 270 degrees in length.

With respect to FIG. 7, the parting line 701 is an elongated L-shape, thereby allowing the extension 702 and central member 700 to form a T-shape. The extension 702 would then fold along folding line 704 atop the central member 700 of the flex 70. In this embodiment, the annular members 703 may run up to 270 degrees in length.

With respect to FIG. 8, the parting line 801 is also L-shaped, but is disposed within the boundaries of the central member 800, thereby allowing the extension 802 to extend within the overall limits of the flex 80. As such, the extension 802 becomes an L-shaped triangle, folding atop the central member 800 across folding line 804. In such an embodiment, the annular members 803 may run up to 315 degrees in length.

Figure 9:
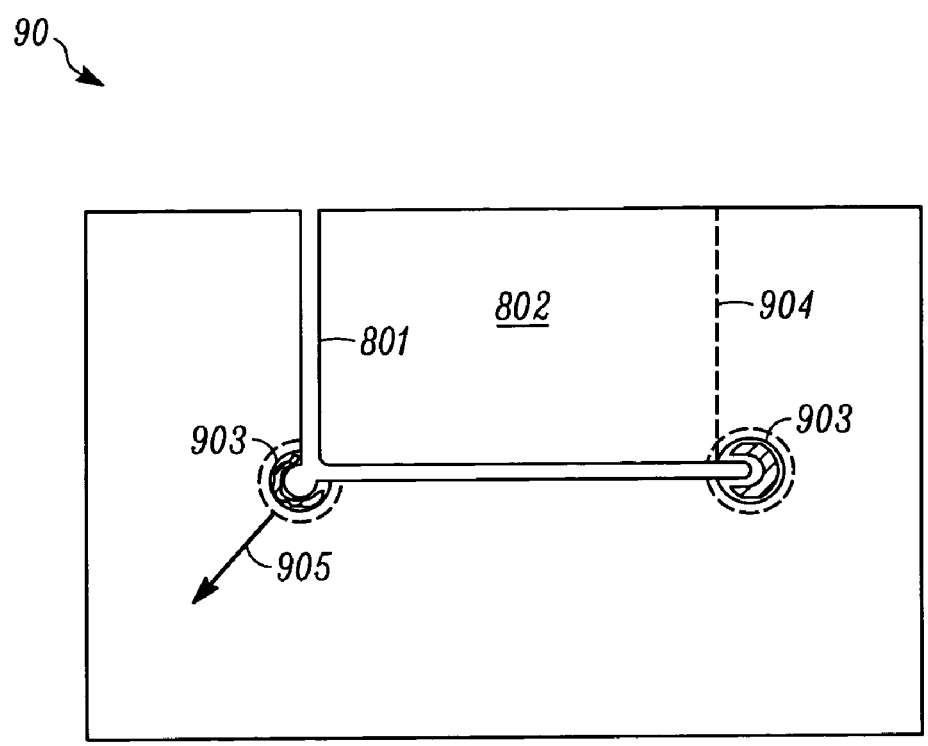

With respect to FIG. 9, the parting line 901 is again L-shaped, but is configured differently from the flex of FIG. 8. The flex 90 of FIG. 9 is designed to allow the extension 902 to "flop" below the central member 900 by folding along line 904. This is often desirable when one component is much larger than the rest. A flopping extension 902 compensates for the additional height of the component.

In this configuration, the annular members 903 are positioned at the vertex of the parting line 901, and at the termination point. An annular member 903 at the vertex is preferable because force 905 tends to shear flexes comprising right angle cuts.

Figure 5:
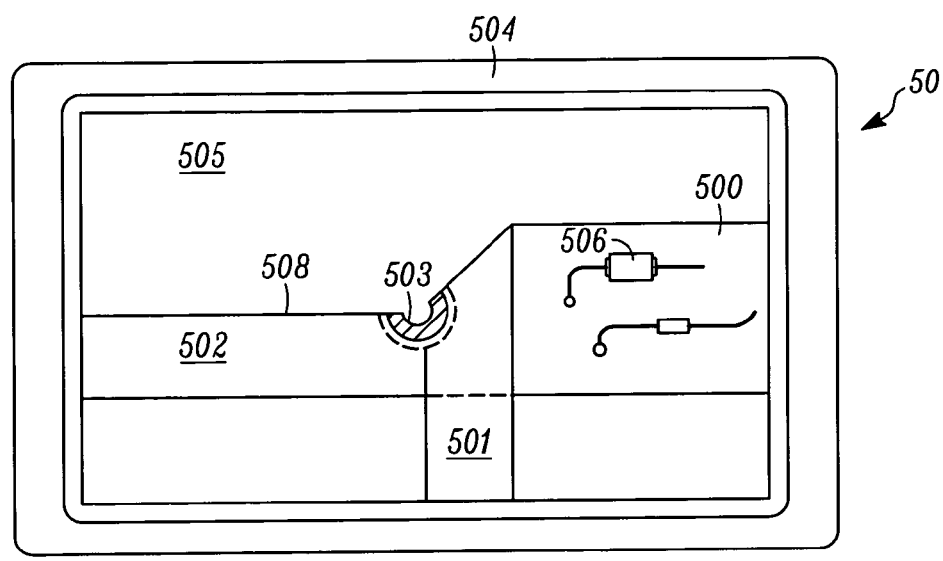
FIG. 5 illustrates a rechargeable battery pack employing a flex in accordance with the invention.

Referring now to FIG. 5, illustrated therein is one exemplary application for a flex in accordance with the invention. This exemplary application is that of a rechargeable battery pack 50. A cell 505 is positioned within a housing 504. As noted above, rechargeable cells require certain circuits, like safety circuits, charging circuits, etc., for operation. Such a circuit may be constructed on a flexible circuit in accordance with the invention.

The flex 507 includes a central member 500 and a folded extension 501. In keeping with the exemplary geometry of the preceding figures, a parting line 508 exists between the first extension 901 and the second extension. An annular member 503 with a second metal deposited atop is disposed about the termination point of the parting line 508. A circuit is constructed on the flex 507 by coupling electrical components 506 to the pads of the flex. While a battery is one application, it will be clear to those of ordinary skill in the art having benefit of this disclosure that other applications work equally well with the flex of the present invention.

While the preferred embodiments of the invention have been illustrated and described, it is clear that the invention is not so limited. Numerous modifications, changes, variations, substitutions, and equivalents will occur to those skilled in the art without departing from the spirit and scope of the present invention as defined by the following claims.

What is claimed is:

1. A flexible circuit substrate, comprising:
   a. at least a first and at least a second layer of flexible material coupled together to form a central member;
   b. at least one extension extending from the central member;
   c. at least one parting line disposed between the central member and the at least one extension, the at least one parting line ending at a termination point;
   d. an annular member comprising a first metal, the annular member being disposed to curve around the termination point; and
   e. a second metal deposited upon the first metal.

2. The substrate of claim 1, further comprising electrically conductive traces disposed between the at least a first and the at least a second layer of flexible material.

3. The substrate of claim 2, further comprising electrically conductive pads disposed atop either the at least a first or the at least a second layer of flexible material.

4. The substrate of claim 3, further comprising electrical components disposed atop the electrically conductive pads.

5. The substrate of claim 1, wherein the at least one extension and the central member form a T-shape.

6. The substrate of claim 1, wherein the at least one parting line is L-shaped.

7. The substrate of claim 1, wherein the at least one parting line is U-shaped.

8. The substrate of claim 1, further comprising an aperture in at least one of the at least a first and the at least a second layers of flexible material, the aperture being disposed about the termination point.

9. The substrate of claim 8, wherein an area of the aperture is less than an area of the annular member.

10. The substrate of claim 9, wherein the first metal is selected from the group consisting of copper, copper alloys and aluminum.

11. The substrate of claim 10, wherein the second metal comprises solder.

12. The substrate of claim 11, wherein the second metal is deposited by way of a method selected from the group consisting of reflow soldering, hand soldering and wave soldering.

13. The substrate of claim 1, further comprising a second aperture disposed about the termination point, wherein the second aperture penetrates both the first layer and the second layer of flexible material.

* * * * *